United States Patent
Vernenker et al.

(10) Patent No.: US 7,116,585 B2
(45) Date of Patent: Oct. 3, 2006

(54) MEMORY SYSTEMS AND METHODS

(75) Inventors: Hemanshu T. Vernenker, Austin, TX (US); Marge Tait, Austin, TX (US); Allen White, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 168 days.

(21) Appl. No.: 10/885,419

(22) Filed: Jul. 6, 2004

(65) Prior Publication Data

US 2006/0007754 A1    Jan. 12, 2006

(51) Int. Cl.
*G11C 7/10* (2006.01)

(52) U.S. Cl. .................. 365/189.05; 365/189.04; 365/154

(58) Field of Classification Search .......... 365/189.05, 365/189.04, 154, 185.11, 189.02, 203, 230.02, 365/230.08
See application file for complete search history.

(56) References Cited

U.S. PATENT DOCUMENTS

| | | | |
|---|---|---|---|
| 6,028,812 A * | 2/2000 | Tanaka | 365/230.03 |
| 6,072,738 A | 6/2000 | Brown | |
| 6,295,238 B1 * | 9/2001 | Tanizaki et al. | 365/201 |
| 6,549,452 B1 * | 4/2003 | Park | 365/154 |
| 2003/0058688 A1 * | 3/2003 | Nguyen | 365/185.11 |

OTHER PUBLICATIONS

McLaury et al., U.S. Appl. No. 10/243,014, filed Sep. 13, 2002 (pp. 1-49, FIG. pp. 1-16).

* cited by examiner

*Primary Examiner*—Van Thu Nguyen
*Assistant Examiner*—Dang Nguyen
(74) *Attorney, Agent, or Firm*—MacPherson Kwok Chen & Heid LLP; Greg J. Michelson

(57) ABSTRACT

Systems and methods are disclosed for memory, including techniques for reading and writing to memory. For example, in accordance of the present invention, a method of implementing a read and a write operation (e.g., a read before write operation) is disclosed for a memory, such as for example for a single port or a multiport memory, with the write operation beginning prior to the completion of the read operation.

22 Claims, 5 Drawing Sheets

MEMORY SYSTEMS AND METHODS

TECHNICAL FIELD

The present invention relates generally to electrical circuits and, more particularly, to memory, such as for example to methods for reading from and writing to the memory.

BACKGROUND

Memory is required in a variety of applications, with many of the applications requiring information to be read from and written to the memory. A typical operation for the memory may be a read-before-write (RBW) operation, where a read operation occurs prior to the write operation within the same clock cycle, with the read operation reading out "old" information stored in the memory prior to the write operation writing "new" information into the memory.

One drawback of a typical memory performing the RBW operation is that the read and write operations are sequential, with the write operation occurring only after the read operation has been completed. Specifically for example during the RBW operation, the write operation may not begin until after the information from the memory is read out on an output data bus after being latched and buffered. This results in certain disadvantages in terms of excessive power consumption and lengthy cycle times. As a result, there is a need for improved techniques for accessing memory, such as for a RBW operation.

SUMMARY

Systems and methods are disclosed herein to provide memory systems and methods. For example, in accordance with an embodiment of the present invention, a method of implementing a read and a write operation (e.g., a read before write operation) is disclosed for a memory, such as for example for a single port or a multiport memory. The write operation may begin prior to the completion of the read operation, which may increase the speed of the RBW operation and may allow a faster cycle time and higher operating frequency. The power consumption may also be reduced due to a wordline of the memory being asserted for a shorter period of time than with conventional techniques.

More specifically, in accordance with one embodiment of the present invention, a memory system includes a memory core having one or more memory cells and bitlines; a read multiplexer adapted to select the bitlines for reading data from at least one of the memory cells upon assertion of a multiplexer control signal; a sense amplifier for providing a logical high or a logical low signal level, upon assertion of a sense amplifier control signal, based on a signal level on the bitlines selected by the read multiplexer; a latch for storing the logical high or the logical low signal level from the sense amplifier to provide as a data output signal; and a write circuit adapted to write data to at least one of the memory cells upon assertion of a write control signal, wherein for a read before write operation, the write control signal is asserted prior to the logical high or the logical low signal level being stored by the latch.

In accordance with another embodiment of the present invention, an integrated circuit includes a plurality of memory cells having associated bitlines; an address decode circuit adapted to select from among the memory cells; a precharge circuit adapted to precharge the bitlines of the memory cells; a read circuit adapted to select from among the bitlines to read from at least one of the memory cells upon assertion of a read control signal; a latch circuit adapted to store data from the at least one memory cell being read; and a write circuit adapted to write data to at least one of the memory cells upon assertion of a write control signal, wherein the write control signal is asserted based upon when the read control signal is deasserted during a read before write operation.

In accordance with another embodiment of the present invention, a method of reading from a memory and writing to the memory includes precharging bitlines of the memory; selecting which bitlines data is to be read from; reading the data provided by the bitlines to provide a data value based on the data; deselecting the bitlines that data is being read from during the reading of the data; and beginning the writing of input data to the memory based upon the deselecting of the bitlines.

In accordance with another embodiment of the present invention, a method of reading from a memory and writing to the memory includes precharging bitlines of the memory; selecting which bitlines data is to be read from; reading the data provided by the bitlines to provide a data value based on the data; and starting the writing of input data to the memory before the reading has been completed.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
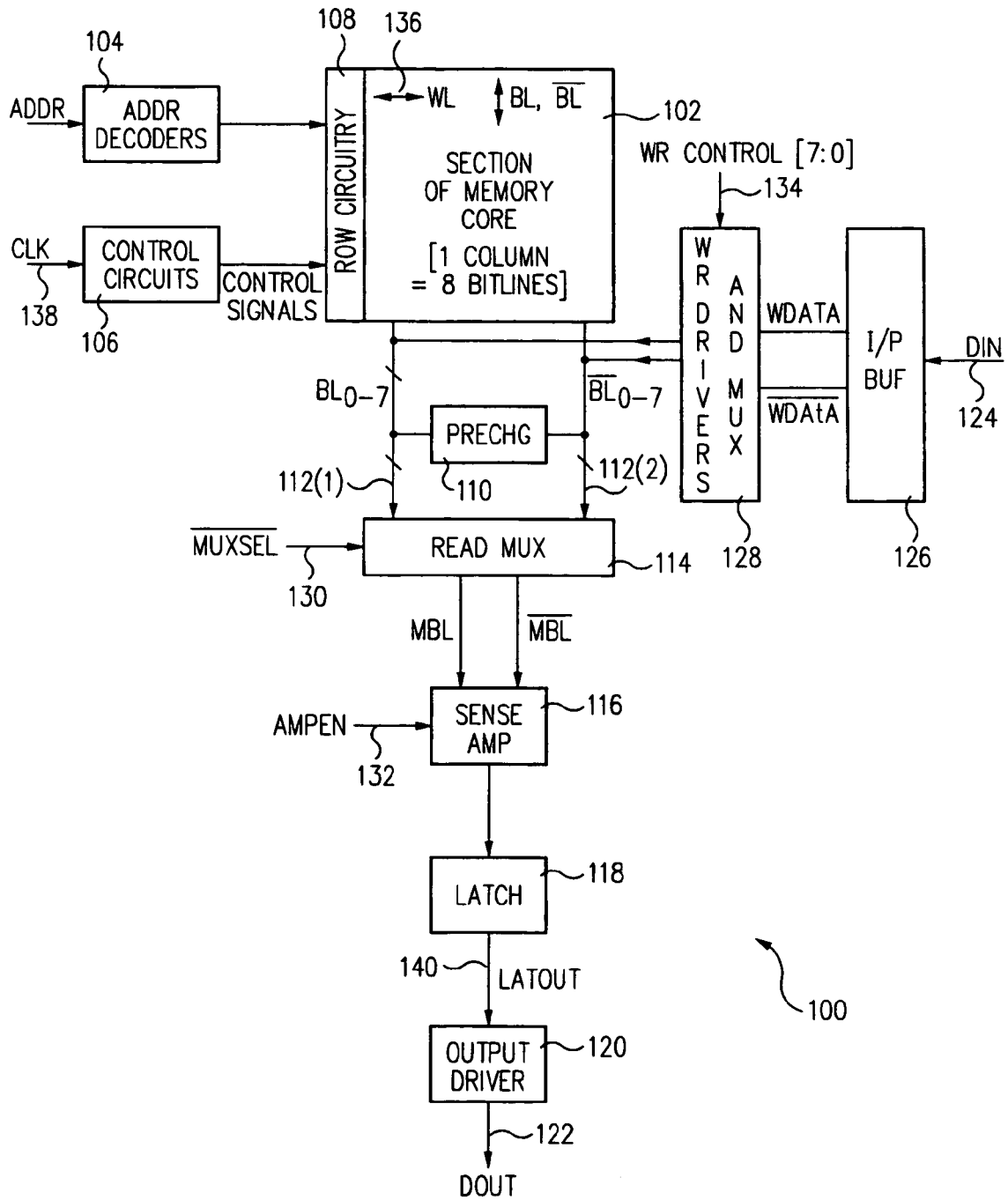
FIG. 1 shows a block diagram illustrating a memory system in accordance with an embodiment of the present invention.

FIG. 1 shows a block diagram illustrating a memory system 100 in accordance with an embodiment of the present invention. Memory system 100 illustrates a memory or a section of a memory (e.g., one column of a memory having a number of columns and rows) with associated peripheral circuits (e.g., row, column, and control circuits). Memory system 100 may be formed, for example, as part of an integrated circuit, such as a programmable logic device or an application specific integrated circuit, or as a separate memory circuit.

Memory system 100 includes memory cells 102, an address decode circuit 104, a control circuit 106, a row circuit 108, a precharge circuit 110, a read multiplexer 114, a sense amplifier 116, a latch 118, an output buffer 120, an input buffer 126, and a write driver circuit 128. Memory cells 102 include the one or more memory cells that provide a memory core of memory system 100. For example, memory system 100 may represent a number of rows and one column of a memory, with one column having, as an example, eight bitlines (i.e., eight bitline pairs, with eight true and eight complement bitlines).

Address decode circuit 104 and row circuit 108 provide the address decoding and row selection, while control circuit 106 receives a clock (CLK) signal 138 and provides appropriate control signals for memory system 100. Prior to a read operation, bitlines 112 (which for this exemplary implementation are separately referenced as true bitlines 112(1) and complement bitlines 112(2)) are precharged by precharge circuit 110. Bitlines 112, during the read operation, develop a small differential voltage on the bitline pairs (i.e., corresponding bitlines 112(1) and 112(2)), with read multiplexer 114 (e.g., a p-channel 8:1 multiplexer controlled by a read multiplexer control signal (MUXSEL) 130 e.g., MUX-SEL_B[7:0] control signal) determining which bitline 112 is allowed to pass its true and complement signal to sense amplifier 116.

When a sufficient differential voltage level has been achieved on bitlines 112 (e.g., approximately 15% of the supply voltage), a sense amplifier control signal (AMPEN) 132 is asserted and read multiplexer control signal 130 is deasserted to isolate sense amplifier 116 from the large capacitance associated with bitlines 112 and allow sense amplifier 116 to provide a rail-to-rail signal that is latched by latch 118 and buffered by output buffer 120 (e.g., an output driver that provides the data stored in memory as a data output (DOUT) signal 122). This completes the read operation.

For a write operation, a data input (DIN) signal 124 is buffered by input buffer 126 and then written into memory cells 102 (e.g., the memory array) by write driver circuit 128 (e.g., drivers and a write multiplexer) when a write control signal (WRCONTROL) 134 is asserted. This completes the write operation.

In general, such as for a conventional technique for reading from and writing data to memory system 100 (e.g., during a RBW operation), data is written (i.e., the "new" data) into memory cells 102 only after the data to be read (i.e., the "old" data) from memory cells 102 is latched by latch 118. A signal notifying that the data is latched by latch 118 is then provided to control circuit 106 to indicate that the read operation is complete so that the write operation can proceed. This conventional technique delays the write operation, increases the cycle time for the RBW operation, and results in additional power consumption (e.g., due to a wordline (WL) 136 of memory cells 102 remaining asserted throughout the process and/or a differential voltage level of bitlines 112 exceeding the necessary separation).

Figure 2:
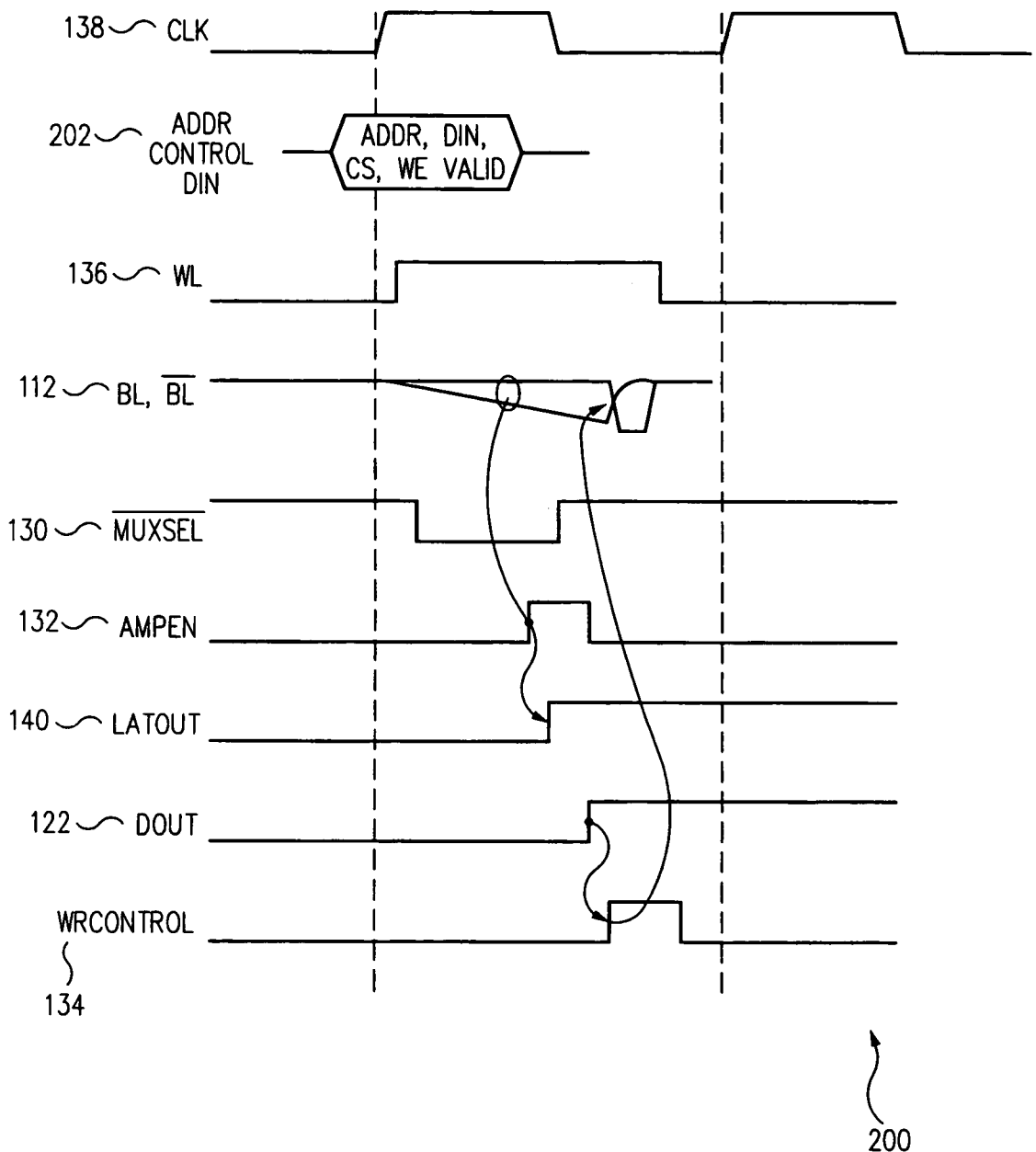
FIG. 2 shows a timing diagram illustrating a conventional technique for accessing memory.

For example, FIG. 2 shows an exemplary timing diagram 200 illustrating a conventional technique for accessing memory system 100 for a RBW operation. Timing diagram 200 includes exemplary waveforms for clock signal 138, representative control and data signals 202 (e.g., address signals (ADDR), data input signal (DIN) 124, and/or write enable (WE)), wordline 136, bitlines 112, read multiplexer control signal 130, sense amplifier control signal 132, a latch out signal (LATOUT) 140, data output signal 122, and write control signal 134.

As illustrated in timing diagram 200, once the necessary signal level separation on bitlines 112 occurs, sense amplifier control signal 132 is asserted, then latch out signal 140 is asserted, and data output signal 122 may also be asserted prior to write control signal 134 being asserted to begin the subsequent write after the read operation. In general, bitlines 112 develop more than the required bitline separation for a read operation (indicated generally by the circled area of bitlines 112 and the following portion of bitlines 112), because the write operation begins only after the data is latched at latch 118 or buffered by buffer 120.

In general, memory system 100 may be viewed as a general block diagram of a typical memory, with its operation as discussed above in reference to FIG. 2. Because of the conventional operation of memory system 100, such as for a RBW operation, memory system 100 requires longer clock cycle times and/or slower cycle times than is necessary. Furthermore, memory system 100 consumes additional power, due to for example wordline 136 remaining asserted for a longer duration than is necessary.

In contrast to conventional techniques for performing a RBW operation, in accordance with an embodiment of the present invention, a technique is disclosed which initiates the write operation prior to the completion of the read operation. For example, in accordance with an embodiment of the present invention, when read multiplexer control signal 130 is deasserted during the read operation, write control signal 134 is then asserted and data from data input signal 124 is written into memory system 100 (e.g., memory cells 102).

A certain time duration (e.g., determined by control circuit 106) may be allocated between when read multiplexer control signal 130 is deasserted and when write control signal 134 is asserted to prevent the possibility of disturbing the data being read by the writing of the "new" data. In general, if write control signal 134 is asserted too quickly (e.g., simultaneously with or prior to when read multiplexer control signal 130 is deasserted), the RBW operation may actually become a write through operation with the data being written appearing on data output signal 122 rather than the "old" data that was stored in memory system 100.

In general for this technique, no feedback signal is required (e.g., in terms of when the data is latched by latch 118) and a faster cycle time and a higher operational speed may be achieved. Additionally, power consumption may be reduced because wordline 136 is asserted for a shorter time period and bitlines 112 develop less of a differential signal level than occurs for conventional techniques during a read operation.

Figure 3:
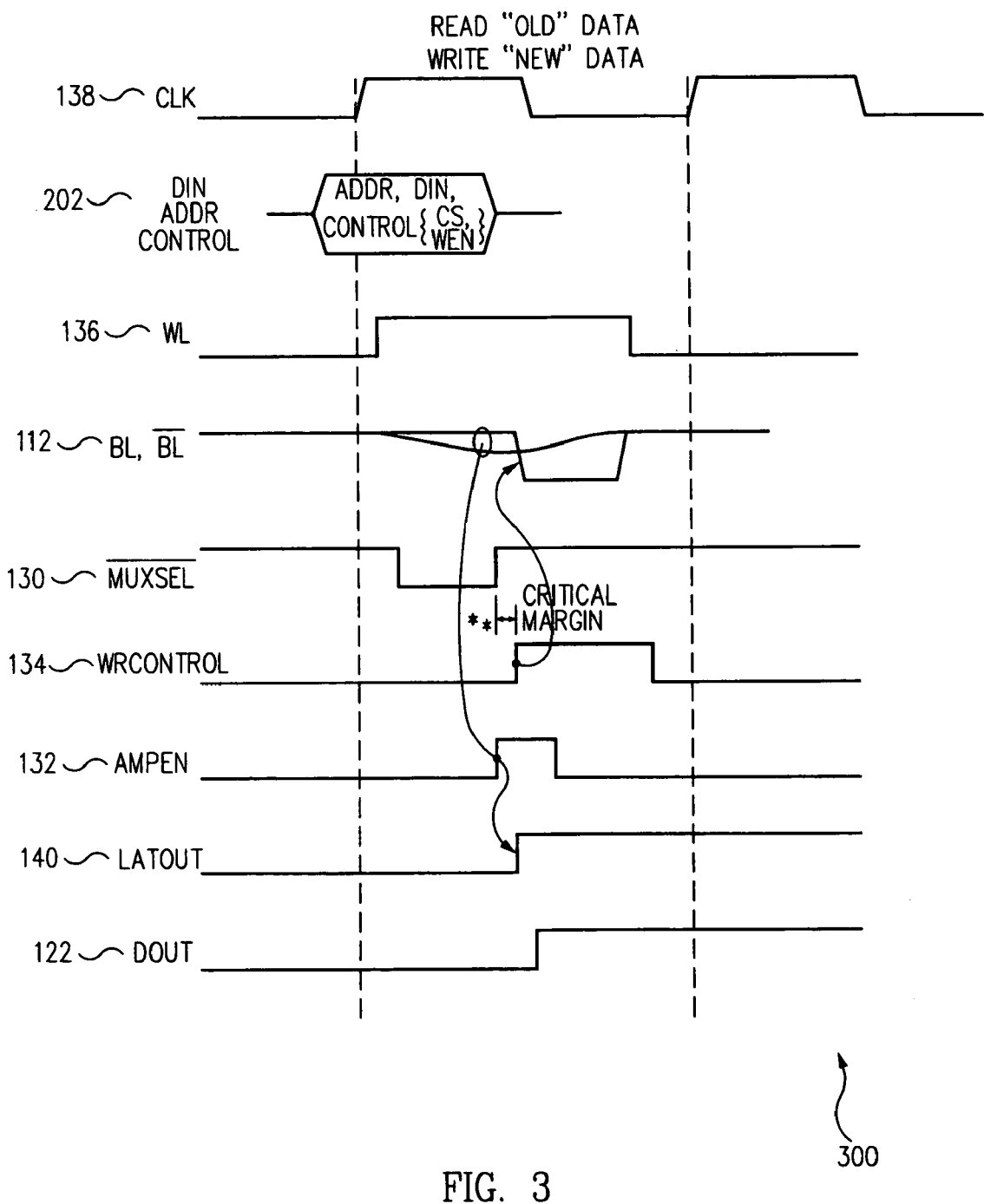
FIG. 3 shows a timing diagram illustrating a technique for accessing memory in accordance with an embodiment of the present invention.

For example, FIG. 3 shows a timing diagram 300 illustrating a technique for accessing memory system 100 for a RBW operation in accordance with an embodiment of the present invention. Timing diagram 300 includes exemplary waveforms for clock signal 138, representative control and data signals 202 (e.g., address signals (ADDR), data input signal (DIN) 124, and/or write enable (WE)), wordline 136, bitlines 112, read multiplexer control signal 130, write control signal 134, sense amplifier control signal 132, latch out signal (LATOUT) 140, and data output signal 122.

As illustrated in timing diagram 300 (in contrast to timing diagram 200), once the necessary signal level separation on bitlines 112 occurs, sense amplifier control signal 132 is asserted, read multiplexer control signal 130 is deasserted, then latch out signal 140 and data output signal 122 are asserted. However, write control signal 134 is asserted soon after (e.g., after a necessary critical margin of delay) read multiplexer control signal 130 is deasserted (and/or sense amplifier control signal 132 is asserted) to begin the write operation, rather than waiting until after latch out signal 140 or data output signal 122 is asserted. In general, bitlines 112 develop no more than the required bitline separation for a read operation (indicated generally by the circled area of bitlines 112), because the write operation begins soon after read multiplexer control signal 130 is deasserted.

Figure 4A:
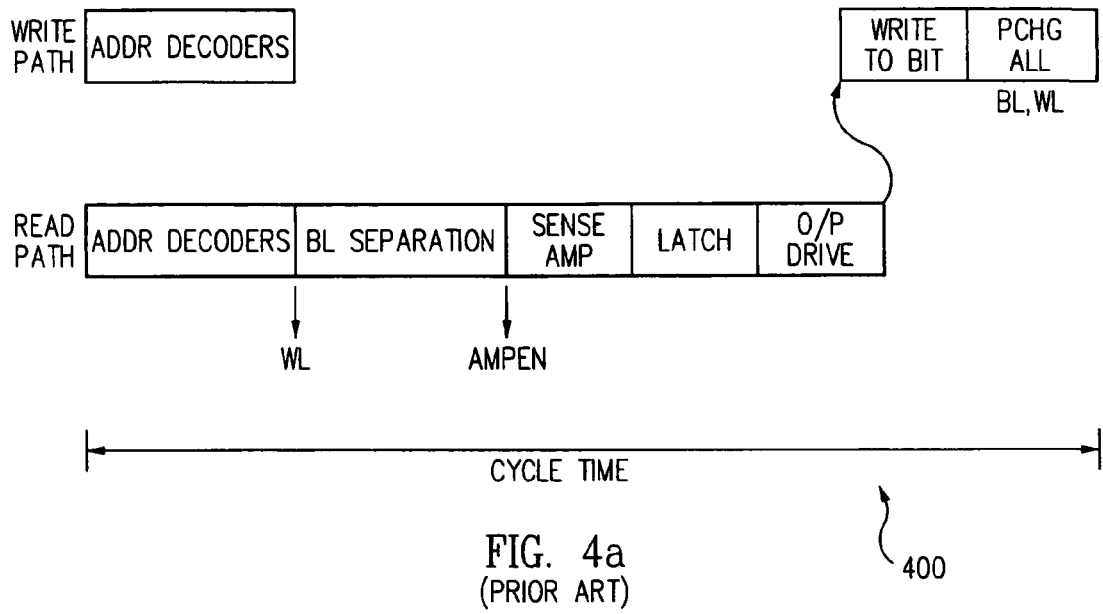
FIG. 4a shows a timing bar diagram illustrating a conventional technique for accessing memory.
Figure 4B:
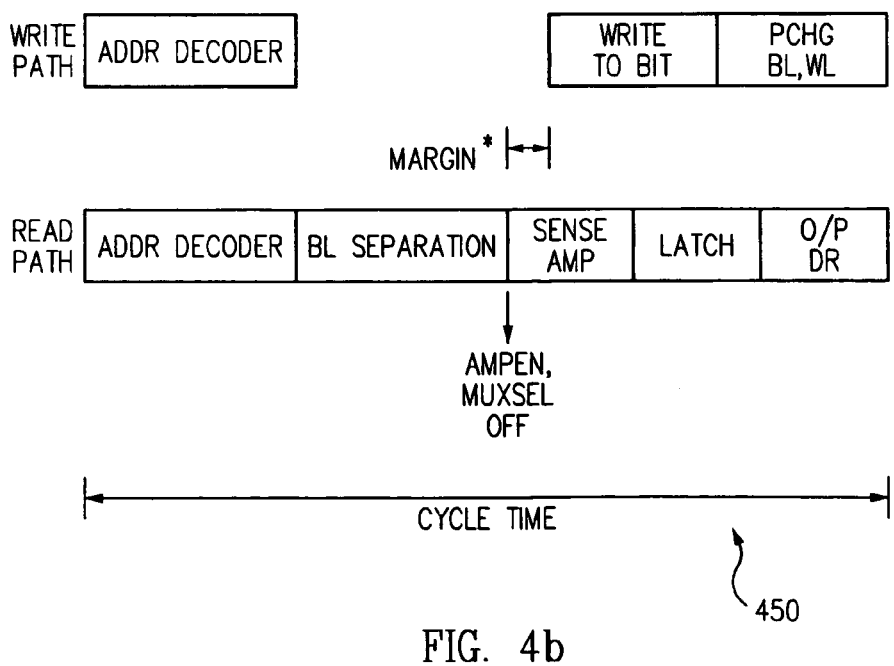
FIG. 4b shows a timing bar diagram illustrating a technique for accessing memory in accordance with an embodiment of the present invention.

As another exemplary illustration, FIG. 4*a* shows a timing bar diagram 400 illustrating a conventional technique for accessing memory system 100, while FIG. 4*b* shows a timing bar diagram 450 illustrating a technique for accessing memory system 100 in accordance with an embodiment of the present invention. Specifically, timing bar diagrams 400 and 450 illustrate functional steps for a conventional method and a method in accordance with an embodiment of the present invention, respectively, of performing a RBW operation for a given corresponding cycle time.

Timing bar diagrams 400 and 450 are similar in certain aspects for a write path and a read path during the RBW operation. For example, the read path performs address decoding (ADDR decoder), bitline separation (BL separation), followed by sense amplification (sense amp), latching (latch), and driving out (O/P Drive) the data being read. Similarly, the write path performs address decoding and writing the data (write to bit) followed by precharging of the bitline and wordline (PCHG all BL, WL).

However, in comparing timing bar diagram 400 to timing bar diagram 450, it can be seen that the cycle time has been reduced by initiating sooner the writing of the data during the RBW operation. Specifically, the writing of the data does not begin in timing bar diagram 400 until the read path has generally completed its functional operations (e.g., writing does not begin until after the latching and possibly driving out of the data being read). In contrast, in timing bar diagram 450, the writing of the data begins roughly after bitline separation is achieved and sense amplification is enabled (e.g., when AMPEN signal asserted and/or MUXSEL signal deasserted). Consequently, the RBW operation in timing bar diagram 450 is sped up relative to timing bar diagram 400, which may lead to a faster cycle time and higher operating frequency, while requiring lower power consumption because the memory wordline is deasserted (i.e., shut off) sooner than with some conventional techniques.

In general, due to the increased parallelism between the read and write paths (e.g., as illustrated in an exemplary fashion in timing bar diagram 450 in FIG. 4*b*), a greater portion of the read and write operations occur in parallel. As an example, timing and pulse generation circuits that generate the control signals (e.g., control circuit 106, which may provide read multiplexer control signal 130, sense amplifier control signal 132, and write control signal 134) provide for some of the read and write operations to occur in parallel and ensure that the write operation to memory cells 102 occur only after the "old" data to be read cannot be written over before being read during the prior read operation (e.g., the data has propagated to sense amplifier 132).

Figure 5:
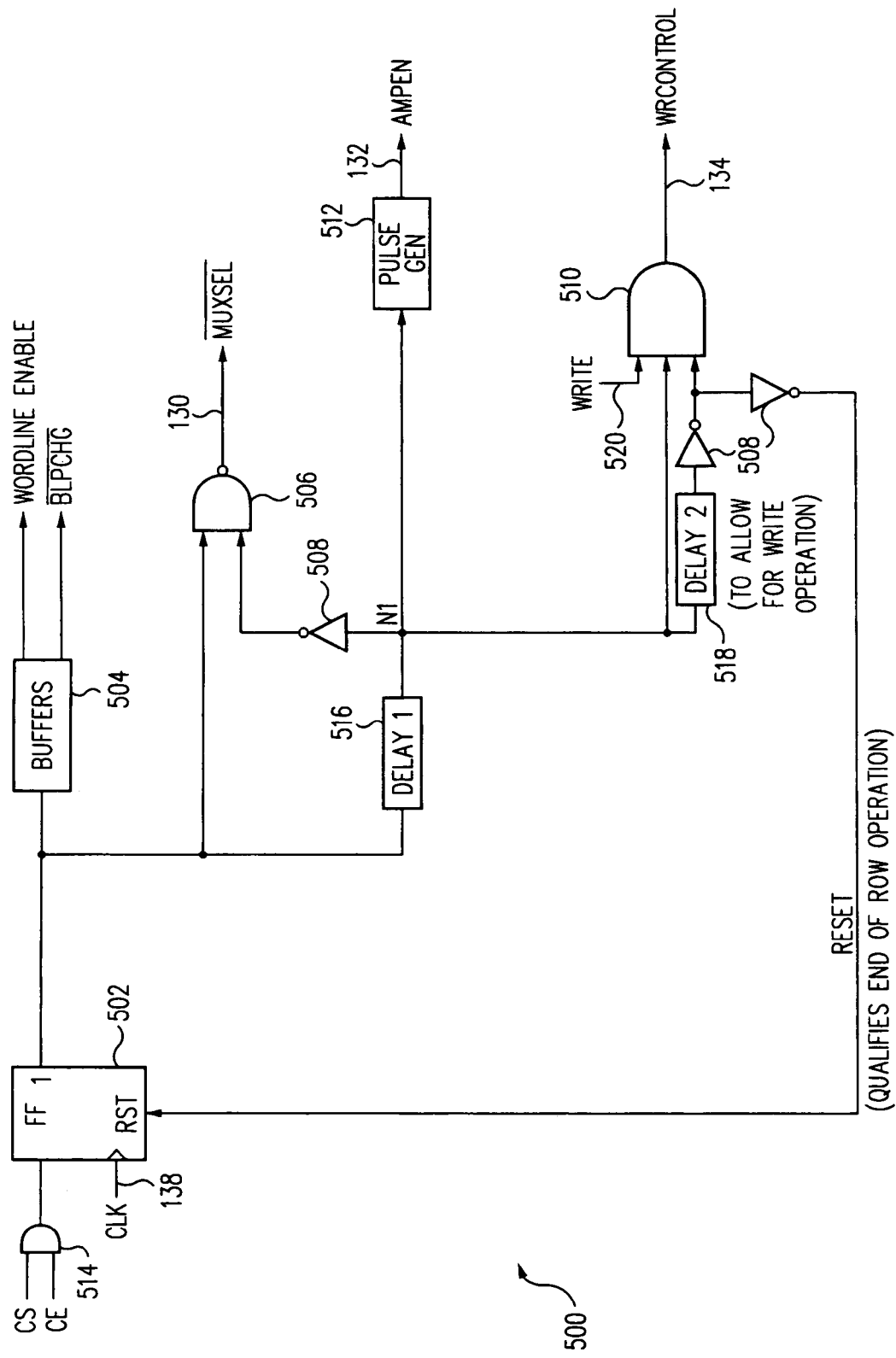
FIG. 5 shows a circuit diagram illustrating a portion of the memory system of FIG. 1 in accordance with an embodiment of the present invention.

FIG. 5 shows a circuit 500, which is an exemplary circuit implementation for all or a portion of control circuit 106 for memory system 100 of FIG. 1 in accordance with an embodiment of the present invention. In general, circuit 500 illustrates an exemplary circuit implementation for generating control signals read multiplexer control signal 130, sense amplifier control signal 132, and write control signal 134.

Circuit 500 includes a flip flop 502, a buffer 504, logic gates 506, 508, 510, and 514, a pulse generator 512, and delay circuits 516 and 518. A chip select (CS) signal and a clock enable (CE) signal are received by logic gate 514 and registered in flip flop 502, which also receives clock signal 138 and provides an output signal that qualifies (e.g., initiates) a memory operation. A write signal 520 indicates whether the memory operation is a read or a write memory operation. In a RBW memory operation, a read is performed during all memory operations (e.g., a read occurs during a regular read operation as well as during a write operation for a RBW operation, with the read operation occurring prior to the write operation).

The output signal from flip flop 502 is provided to buffer 504, logic gate 506, and delay circuit 516. Buffer 504 generates a wordline enable signal for row address (ADDR) decoders (e.g., address decode circuit 104 of FIG. 1) and a bitline precharge signal (labeled $\overline{blpchg}$) for precharge circuits (e.g., precharge circuit 110 of FIG. 1). Logic gate 506 generates read multiplexer control signal 130.

Delay circuit 516 (e.g., a delay chain or other type of signal delay circuit element) allows sufficient signal separation (e.g., 15% of the supply voltage (Vcc)) to develop between the bitline pair (e.g., from bitlines 112) before sense amplifier control signal 132 is asserted (via pulse generator 512). Delay circuit 516 also determines when to disable (deassert) read multiplexer control signal 130 to switch off read multiplexer 114 (e.g., when the bitline pair develop sufficient signal separation). Delay circuit 516 also determines when the write operation can begin via logic gate 510 by asserting write control signal 134.

Delay circuit 518 (e.g., a delay chain or other type of signal delay circuit element) allows sufficient time for the write operation to occur. Once the write operation is completed (e.g., as determined by delay circuit 518), a reset signal (RESET) is asserted to reset various registers (e.g., flip flop 502). The memory block (e.g., memory system 100) then returns to its initial state with all bitlines precharged, wordlines deactivated, and control signals appropriately set (e.g., disabled).

It should be noted that the critical margin, noted in FIG. 3 between the assertion of read multiplexer control signal 130 and write control signal 134, may be provided by circuit 500 or the margin or delay may be provided appropriately to write control signal 134 after generation by logic gate 510. Furthermore, the critical margin may vary depending upon the system requirements (e.g., specific design implementation or application), with the main criteria being that the write operation does not change the "new" data prior to the read operation capturing the "old" data.

For example in circuit 500, the critical margin may be satisfied by the path delays associated with the generation of write control signal 134 relative to path delays associated with the generation of read multiplexer control signal 130. Alternatively, an additional delay may be added to the signal path from delay circuit 516 to logic gate 510 (i.e., the middle input to logic gate 510) to appropriately delay the assertion of write control signal 134 and provide the desired margin.

In general, when a signal from delay circuit 516 is asserted, read multiplexer control signal 130 is asserted (to switch off the read multiplexer), sense amplifier control signal 132 is asserted (to activate the sense amplifier), and write control signal 134 is asserted (to begin the write operation). In contrast, conventional techniques include additional delays between the read operation and the write operation, with the read operation requiring completion prior to the write operation beginning, which results in an increased RBW operation cycle time and additional power consumption.

Embodiments described above illustrate but do not limit the invention. It should also be understood that numerous modifications and variations are possible in accordance with the principles of the present invention. Accordingly, the scope of the invention is defined only by the following claims.

We claim:

1. A memory system comprising:
   a memory core having one or more memory cells and bitlines;
   a read multiplexer adapted to select the bitlines for reading data from at least one of the memory cells upon assertion of a multiplexer control signal;
   a sense amplifier for providing a logical high or a logical low signal level, upon assertion of a sense amplifier control signal, based on a signal level on the bitlines selected by the read multiplexer;
   a latch for storing the logical high or the logical low signal level from the sense amplifier to provide as a data output signal; and
   a write circuit adapted to write data to at least one of the memory cells upon assertion of a write control signal, wherein for a read before write operation, the write control signal is asserted prior to the logical high or the logical low signal level being stored by the latch.

2. The memory system of claim 1, wherein the write control signal is asserted based upon a deassertion of the multiplexer control signal and/or upon an assertion of the sense amplifier control signal.

3. The memory system of claim 1, wherein the read before write operation occurs within a single clock cycle for the memory system.

4. The memory system of claim 1, further comprising an address circuit adapted to select from among the one or more memory cells of the memory core.

5. The memory system of claim 1, further comprising a control circuit adapted to enable reading data from or writing data to the memory cells of the memory core, wherein the control circuit provides the write control signal, the multiplexer control signal, and/or the sense amplifier control signal.

6. The memory system of claim 1, further comprising a precharge circuit adapted to precharge the bitlines and/or a wordline of the memory system.

7. The memory system of claim 1, wherein the memory system comprises a plurality of the memory cells arranged in columns and rows.

8. The memory system of claim 1, wherein the memory system forms part of an integrated circuit.

9. An integrated circuit comprising:
   a plurality of memory cells having associated bitlines;
   an address decode circuit adapted to select from among the memory cells;
   a precharge circuit adapted to precharge the bitlines of the memory cells;
   a read circuit adapted to select from among the bitlines to read from at least one of the memory cells upon assertion of a read control signal;
   a latch circuit adapted to store data from the at least one memory cell being read; and
   a write circuit adapted to write data to at least one of the memory cells upon assertion of a write control signal, wherein the write control signal is asserted based upon when the read control signal is deasserted during a read before write operation.

10. The integrated circuit of claim 9, further comprising a sense amplifier adapted to read data from the selected bitlines, upon assertion of a sense amplifier control signal, and provide the data to the latch circuit.

11. The integrated circuit of claim 10, wherein the write control signal is asserted based upon when the read control signal is deasserted and/or the sense amplifier control signal is asserted during a read before write operation.

12. The integrated circuit of claim 9, wherein the integrated circuit comprises a programmable logic device.

13. The integrated circuit of claim 9, further comprising a control circuit adapted to provide the read control signal and the write control signal.

14. The integrated circuit of claim 9, further comprising:
    an output driver circuit adapted to provide the data stored in the latch circuit as a data output signal; and
    an input buffer adapted to receive input data and provide the input data to the write circuit to write to the memory cells.

15. A method of reading from a memory and writing to the memory, the method comprising:
    precharging bitlines of the memory;
    selecting which bitlines data is to be read from;
    reading the data provided by the bitlines to provide a data value based on the data;
    deselecting the bitlines that data is being read from during the reading of the data and prior to the data being latched; and
    beginning the writing of input data to the memory based upon the deselecting of the bitlines.

16. The method of claim 15, further comprising:
    latching the data value after assertion of a write control signal as part of the beginning of the writing of input data to the memory; and
    providing the data value as a data output signal.

17. The method of claim 15, wherein the reading of the data and the writing to the memory of the input data occurs within a clock cycle.

18. The method of claim 15, further comprising receiving an input data signal which provides the input data to write to the memory.

19. The method of claim 15, further comprising controlling the reading of the data and the writing of the input data so that the data is read prior to the writing of the input data.

20. A method of reading from a memory and writing to the memory, the method comprising:
    precharging bitlines of the memory;
    selecting which bitlines data is to be read from;
    reading the data provided by the bitlines to provide a data value based on the data;
    latching the data value;
    starting the writing of input data to the memory before the reading has been completed by assertion of a write control signal prior to the latching; and
    providing the data value as a data output signal.

21. The method of claim 20, wherein the reading and the starting of the writing is part of a read before write operation, with the reading and the writing being completed within a clock cycle.

22. The method of claim 20, wherein the reading and the starting of the writing is part of a read before write operation, with the reading and the writing being completed within a clock cycle, and the method further comprises:
  deselecting the bitlines selected during the selecting, and
  wherein the latching is based upon a latch control signal, with the assertion of the write control signal based on at least one of the deselecting and an assertion of the latch control signal.

* * * * *